(12) United States Patent
Noborio

(10) Patent No.: US 12,288,817 B2
(45) Date of Patent: Apr. 29, 2025

(54) SEMICONDUCTOR DEVICE AND METHOD FOR MANUFACTURING THE SAME

(71) Applicants: DENSO CORPORATION, Kariya (JP); TOYOTA JIDOSHA KABUSHIKI KAISHA, Toyota (JP); MIRISE Technologies Corporation, Nisshin (JP)

(72) Inventor: Masato Noborio, Nisshin (JP)

(73) Assignees: DENSO CORPORATION, Kariya (JP); TOYOTA JIDOSHA KABUSHIKI KAISHA, Toyota (JP); MIRISE Technologies Corporation, Nisshin (JP)

( * ) Notice: Subject to any disclaimer, the term of this patent is extended or adjusted under 35 U.S.C. 154(b) by 483 days.

(21) Appl. No.: 17/871,231

(22) Filed: Jul. 22, 2022

(65) Prior Publication Data

US 2023/0065815 A1 Mar. 2, 2023

(30) Foreign Application Priority Data

Aug. 31, 2021 (JP) .................................. 2021-141924

(51) Int. Cl.
*H01L 29/78* (2006.01)
*H01L 21/04* (2006.01)
(Continued)

(52) U.S. Cl.
CPC ........ *H01L 29/7811* (2013.01); *H01L 21/046* (2013.01); *H01L 29/0623* (2013.01);
(Continued)

(58) Field of Classification Search
CPC .......... H01L 21/26513; H01L 29/0615; H01L 29/0619; H01L 29/0623; H01L 29/0657;
(Continued)

(56) References Cited

U.S. PATENT DOCUMENTS 10,964,809 B2 * 3/2021 Noborio .............. H01L 29/1095
2018/0166531 A1 6/2018 Bolotnikov et al.
(Continued)

FOREIGN PATENT DOCUMENTS

JP 2013-102087 A 5/2013
JP 2015-070185 A 4/2015

*Primary Examiner* — Fazli Erdem
(74) *Attorney, Agent, or Firm* — Posz Law Group, PLC

(57) ABSTRACT

A semiconductor device has a cell region formed with a semiconductor element and an outer peripheral region surrounding the cell region. The outer peripheral region includes a guard ring part having a plurality of guard rings of the second conductivity-type, and a plurality of guard ring column regions of the second conductivity-type. Each of the guard rings is disposed in a surface layer portion of the drift layer and has a frame shape surrounding the cell region. The guard ring column regions are extended from the guard rings toward the substrate. Each of the guard ring column regions has a width smaller than a width of each of the guard rings in a direction along a planar direction of the substrate in a predetermined cross-section defined along the cell region and the outer peripheral region. At least two guard ring column regions are provided for each guard ring.

9 Claims, 18 Drawing Sheets

(51) Int. Cl.
*H01L 29/06* (2006.01)
*H01L 29/10* (2006.01)
*H01L 29/16* (2006.01)
*H01L 29/66* (2006.01)

(52) U.S. Cl.
CPC ...... *H01L 29/1095* (2013.01); *H01L 29/1608* (2013.01); *H01L 29/66068* (2013.01); *H01L 29/7813* (2013.01)

(58) Field of Classification Search
CPC ............. H01L 29/0696; H01L 29/1095; H01L 29/1608; H01L 29/41741; H01L 29/4236; H01L 29/66068; H01L 29/66734; H01L 29/7396; H01L 29/7397; H01L 29/7811; H01L 29/7813
USPC ........................................................ 257/484
See application file for complete search history.

(56) References Cited

U.S. PATENT DOCUMENTS

| | | |
|---|---|---|
| 2019/0140048 A1 | 5/2019 | Bolotnikov et al. |
| 2019/0148485 A1 | 5/2019 | Hamada et al. |
| 2019/0181260 A1 | 6/2019 | Maeta |
| 2020/0227549 A1 | 7/2020 | Noborio et al. |
| 2020/0328273 A1 | 10/2020 | Sakata |
| 2021/0074847 A1 | 3/2021 | Maeta |

* cited by examiner

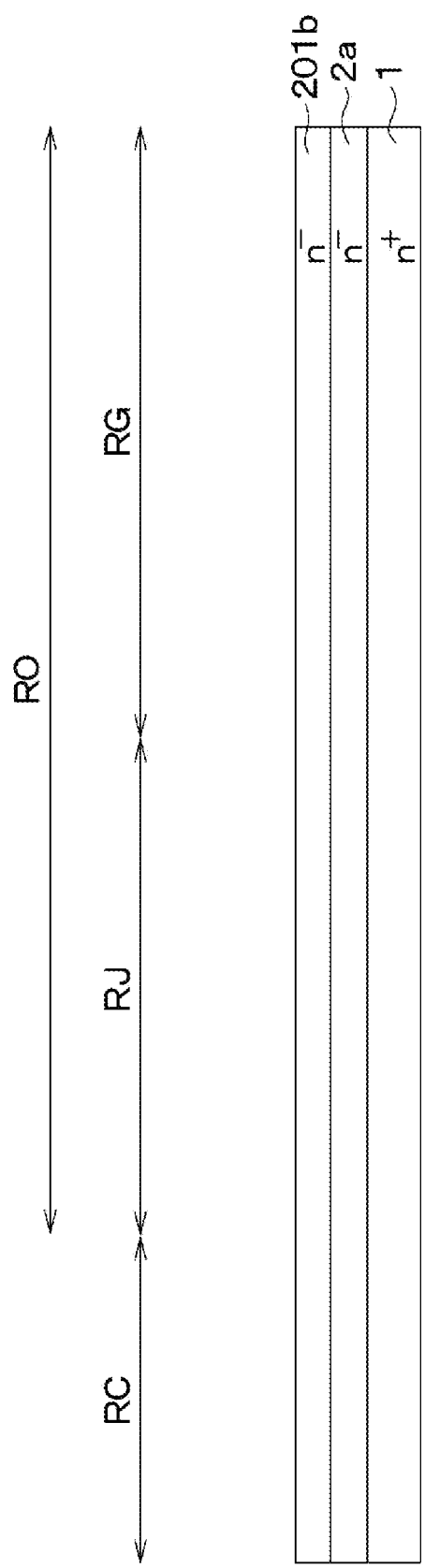

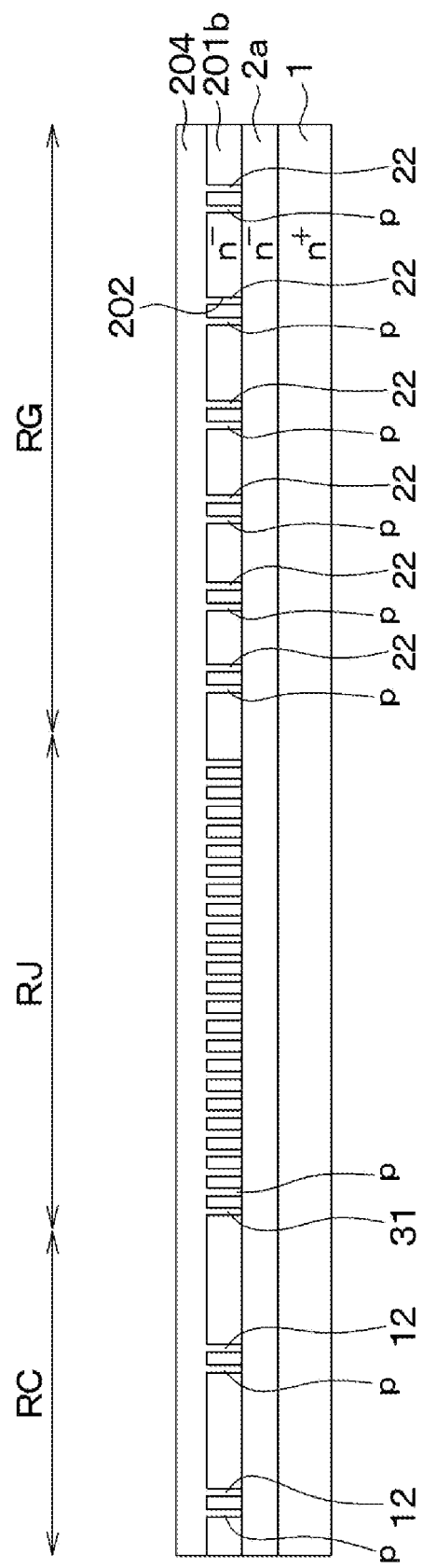

SEMICONDUCTOR DEVICE AND METHOD FOR MANUFACTURING THE SAME

CROSS REFERENCE TO RELATED APPLICATION

The present application claims the benefit of priority from Japanese Patent Application No. 2021-141924 filed on Aug. 31, 2021. The entire disclosures of the above application are incorporated herein by reference.

TECHNICAL FIELD

The present disclosure relates to a semiconductor device having a guard ring part in an outer peripheral region and a method for manufacturing the same.

BACKGROUND

For example, a semiconductor device has a cell region formed with a semiconductor element such as a metal oxide semiconductor field effect transistor (MOSFET) and an outer peripheral region surrounding the cell region. Such a semiconductor device may have a drift layer, and the MOSFET may be provided by a base region, a source region and the like formed in the cell region. Further, such a semiconductor device may have a guard ring part in the outer peripheral region for improving a breakdown voltage of the semiconductor element. The guard ring part is provided with a plurality of guard rings formed in a surface layer portion of the drift layer.

SUMMARY

The present disclosure describes a semiconductor device having a cell region formed with a semiconductor element and an outer peripheral region surrounding the cell region and having a guard ring part formed with guard rings and guard ring column regions, and a method for manufacturing the semiconductor device.

BRIEF DESCRIPTION OF THE DRAWINGS

Objects, features and advantages of the present disclosure will become more apparent from the following detailed description made with reference to the accompanying drawings, in which:

FIG. 4B is a cross-sectional view showing a manufacturing process of the SiC semiconductor device continued from FIG. 4A;

FIG. 6B is a cross-sectional view showing a manufacturing process of the SiC semiconductor device continued from FIG. 6A.

DETAILED DESCRIPTION

Figure 1:
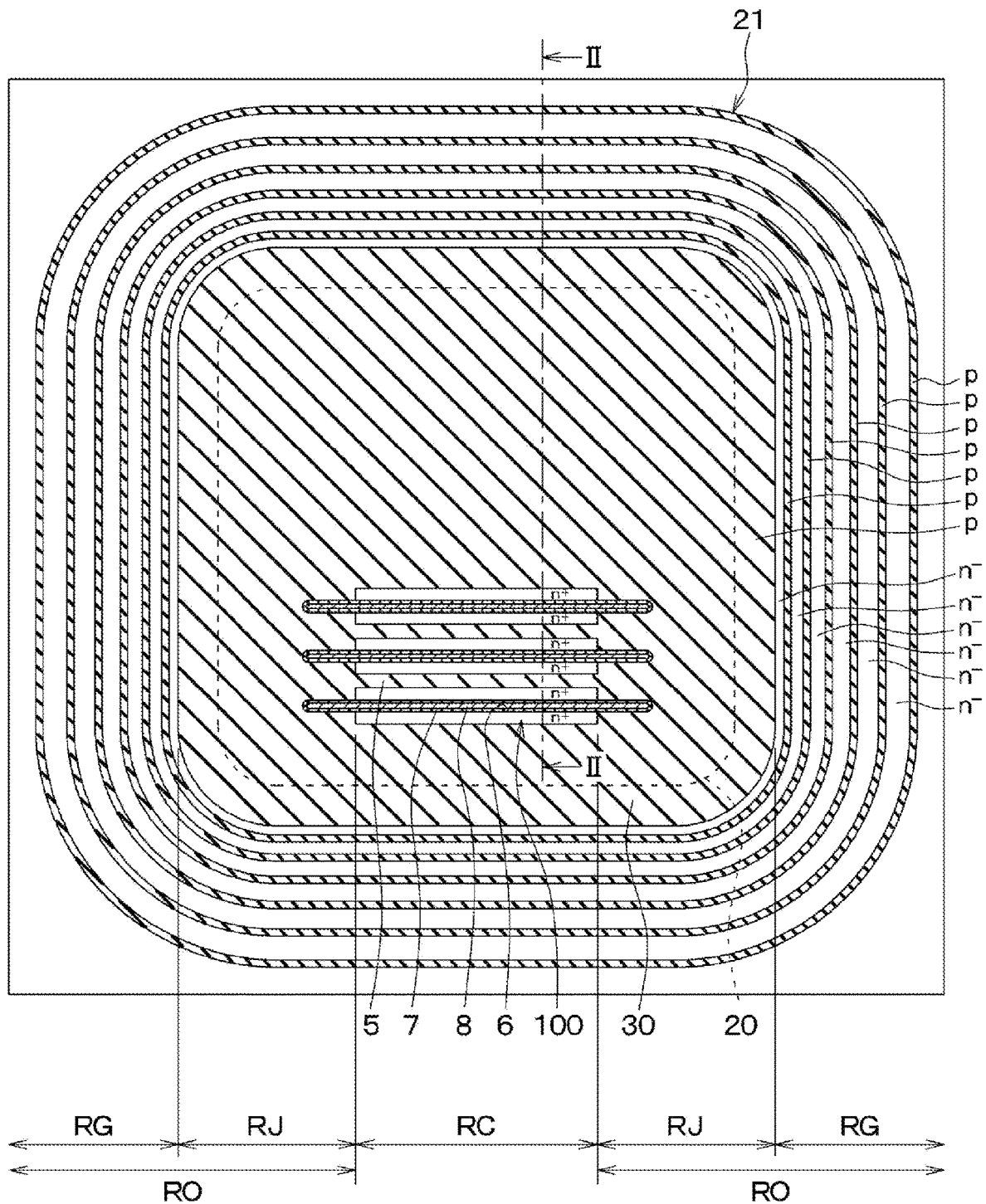
FIG. 1 is a top layout diagram showing a layout in a SiC semiconductor device according to a first embodiment.

To begin with, a relevant technology will be described only for understanding the embodiments of the present disclosure.

For example, a semiconductor device has a cell region formed with a semiconductor element such as MOSFET and an outer peripheral region surrounding the cell region. Such a semiconductor device may have a drift layer, and the MOSFET may be provided by a base region, a source region and the like formed in the cell region. Further, such a semiconductor device may have a guard ring part in the outer peripheral region for improving a breakdown voltage of the semiconductor element. The guard ring part may be provided with a plurality of guard rings formed in a surface layer portion of the drift layer. Further, the plurality of guard rings may be formed so as to be concentric with each other surrounding the cell region.

In such a semiconductor device, equipotential lines are extended from the cell region toward the outer peripheral region and are gradually terminated by the guard ring part, so that the electric field concentration can be alleviated and the breakdown voltage can be improved.

The inventors of the present disclosure are considering to increase the impurity concentration of the drift layer in order to reduce the on-resistance of the MOSFET. However, in the semiconductor device described above, there is a concern that the breakdown voltage may be excessively lowered by increasing the impurity concentration of the drift layer, though the guard ring part is formed.

The present disclosure provides a semiconductor device capable of suppressing an excessive decrease in breakdown voltage and a method for manufacturing the semiconductor device.

According to an aspect of the present disclosure, the semiconductor device includes a cell region provided with a semiconductor element, and an outer peripheral region surrounding an outer periphery of the cell region. The semiconductor device further includes: a substrate of a first or second conductivity-type; a drift layer of the first conductivity-type, a first electrode and a second electrode. The drift layer is disposed on the substrate and has an impurity concentration lower than that of the substrate. The first electrode is disposed opposite to the substrate with respect to the drift layer, and electrically connected to the semiconductor element provided in the cell region. The second electrode is disposed opposite to the drift layer with respect to the substrate, and electrically connected to the semiconductor element provided in the cell region. The outer peripheral region includes a guard ring part having a plurality of guard rings of the second conductivity-type, and a plurality of guard ring column regions of the second conductivity-type. Each of the plurality of guard rings is disposed in a surface layer portion of the drift layer and has a frame shape surrounding the cell region. The plurality of guard ring column regions are extended from the guard rings toward the substrate. Each of the plurality of guard ring column regions has a width smaller than a width of each of the plurality of guard rings in a direction along a planar direction of the substrate in a predetermined cross-section defined along the cell region and the outer peripheral region. At least two guard ring column regions are provided for each of the plurality of guard rings.

In the semiconductor device described above, since at least two guard ring column regions are provided for the guard ring, the breakdown voltage of the guard ring part can be sufficiently improved. Therefore, even if the impurity concentration of the drift layer is increased, it is possible to suppress the breakdown voltage of the guard ring part from being excessively lowered.

According to an aspect of the present disclosure, a method for manufacturing the semiconductor device includes: preparing the substrate; arranging a first drift layer constituent portion for constituting the drift layer on the substrate; forming the plurality of guard ring column regions in the drift layer constituent portion; arranging a second drift layer constituent portion on the first drift layer constituent portion, after the forming of the plurality of guard ring column regions; forming the plurality of guard rings in the second drift layer constituent portion to be connected to the guard ring column regions, and arranging a third drift layer constituent portion on the second drift layer constituent portion, to thereby form the drift layer with the first and second drift layer constituent portions.

According to the method described above, the semiconductor device in which the plurality of guard ring column regions are connected to the guard ring is manufactured. Further, since the width of the guard ring column region is narrower than the width of the guard ring, even if a misalignment occurs between the guard ring and the guard ring column region when forming the guard ring, the guard ring and the guard ring column region are properly connected.

Hereinafter, embodiments of the present disclosure will be described with reference to the drawings. In the embodiments described hereinafter, the same or equivalent parts are designated with the same reference numerals.

First Embodiment

A first embodiment will be described with reference to the drawings. In the present embodiment, a semiconductor device is exemplified by a SiC semiconductor device in which an inverted-type MOSFET having a trench gate structure is formed.

As shown in FIG. 1, the SiC semiconductor device has a cell region RC in which a MOSFET 100 of a trench gate structure is formed, and an outer peripheral region RO surrounding the cell region RC. The outer peripheral region RO includes a guard ring part RG and a connecting part RJ. The connecting part RJ is located inside the guard ring part RG, that is, between the cell region RC and the guard ring part RG. Although FIG. 1 is not a cross-sectional view, hatchings are partially shown for easy understanding.

Figure 2:
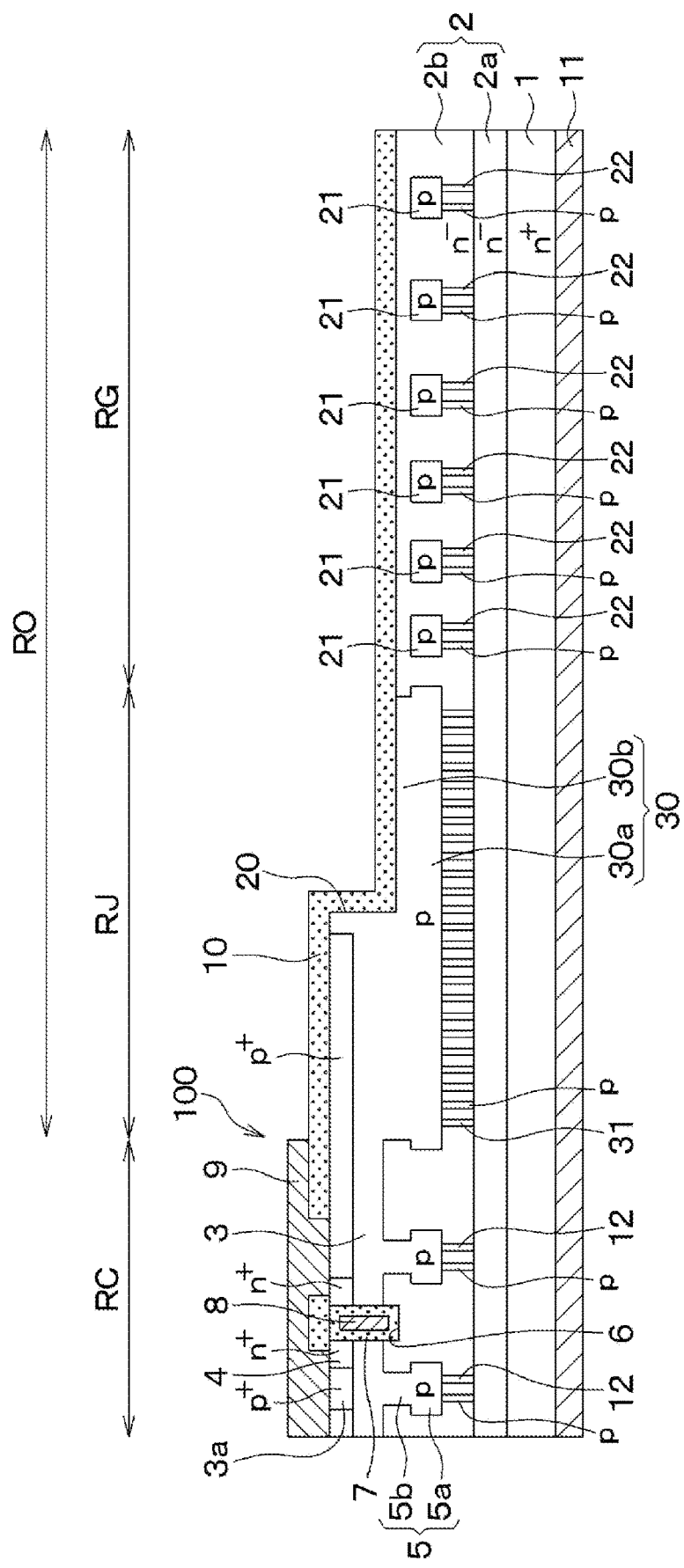
FIG. 2 is a cross-sectional view of the SiC semiconductor device taken along a line II-II shown in FIG. 1.

As shown in FIG. 2, the SiC semiconductor device is formed by using an $n^+$-type substrate 1 made of SiC. An $n^-$-type drift layer 2 and a p-type base region 3 are disposed on a main surface of the substrate 1, and are made of SiC by epitaxial growth or the like. An $n^+$-type source region 4 is formed in a surface layer portion of the base region 3.

For example, the substrate 1 is an off substrate having an n-type impurity concentration of $1.0 \times 10^{19}/cm^3$, and a (0001) Si surface as a top surface and an off direction in a <11-20> direction. In the present embodiment, the drift layer 2 includes a low-concentration layer 2a on the substrate 1, and a high-concentration layer 2b stacked on the low-concentration layer 2a. The high-concentration layer 2b has a higher impurity concentration than the low-concentration layer 2a. For example, the low-concentration layer 2a has an n-type impurity concentration of $1.0 \times 10^{15}$ to $5.0 \times 10^{16}/cm^3$, and the high-concentration layer 2b has an n-type impurity concentration of $1.0 \times 10^{16}/cm^3$ to $5.0 \times 10^{17}/cm^3$.

In the base region 3, a channel region is formed. For example, the base region 3 has a p-type impurity concentration of approximately $2.0 \times 10^{17}/cm^3$, and a thickness of 300 nm. The source region 4 has an impurity concentration higher than that of the drift layer 2. For example, the surface layer portion of the source region 4 has an n-type impurity concentration of $2.5 \times 10^{18}/cm^3$ to $1.0 \times 10^{19}/cm^3$, and the source region 4 has a thickness of approximately 0.5 micrometers (μm). Further, a p-type contact region 3a is formed in the surface layer portion of the base region 3 at a position interposed between the source regions 4. The contact region 3a is formed by partly increasing the p-type impurity concentration higher than that of the base region 3.

The base region 3 and the source region 4 are left on the surface side of the substrate 1 in the cell region RC, whereas a recess 20 is formed in the guard ring part RG so as to penetrate the base region 3 and to reach the high concentration layer 2b of the drift layer 2. Therefore, the SiC semiconductor device of the present embodiment has a configuration including a mesa part in which the cell region RC and the connecting part RJ are projected from the guard ring part RG.

In the cell region RC, a p-type cell deep layer 5 is formed in the surface layer portion of the drift layer 2. The p-type cell deep layer 5 has a p-type impurity concentration higher than that of the base region 3, and is connected to the base region 3. More specifically, the cell deep layer 5 extends from the base region 3 toward the substrate 1, and ends at a predetermined depth in the drift layer 2. As will be described later in detail, the cell deep layer 5 of the present embodiment is formed by ion-implantation of a p-type impurity. The cell deep layer 5 has a bottom surface at the same level as a bottom surface of the guard ring 21, which will be described later in detail.

Plural cell deep layers 5 are arranged at equal intervals in the drift layer 2. The plural cell deep layers 5 are arranged apart from each other without intersections. That is, the cell deep layers 5 are arranged in a striped shape. The base region 3 and the source region 4 are formed on the cell deep layers 5.

The cell deep layers 5 have the same impurity concentration, the same width and the same depth with each other. For example, each of the cell deep layers 5 has the p-type impurity concentration of $1.0 \times 10^{17}$ to $1.0 \times 10^{19}/cm^3$, and the depth of approximately 2.0 μm. The cell deep layers 5 are extended in the same direction as a trench gate structure, which will be described later. That is, each of the cell deep layers 5 has a longitudinal direction same as the trench gate structure. Each of the cell deep layers 5 has the longitudinal direction along the <11-20> direction same as the off direction. Each of the cell deep layers 5 is extended over from an end of the cell region RC to the other end of the cell region RC.

The cell deep layer 5 connects to a connecting deep layer 30 of the connecting part RJ, which is formed outside of the cell region RC, at the opposite ends of a trench gate structure. The connecting deep layer 30 will be described later in detail. In FIG. 1, the cell deep layers 5 and the connecting deep layer 30 are shown with solid line hatching.

In the present embodiment, the cell deep layer 5 includes a first cell deep layer 5a and a second cell deep layer 5b. The first cell deep layer 5a is arranged apart from the base region 3, and the second cell deep layer 5b connects between the first cell deep layer 5a and the base region 3. When a dimension along a planar direction of the substrate in a predetermined cross-section defined along the cell region RC and the outer peripheral region RO is referred to as a width, the first cell deep layer 5a has a width greater than that of the second cell deep layer 5b. For example, the predetermined cross-section corresponds to the cross-section shown in FIG. 2, and the width corresponds to the dimension in the left and right direction in FIG. 2. In the following descriptions, the predetermined cross-section along the cell region RC and the outer peripheral region RO is simply referred to as the predetermined cross-section, and the dimension included in the predetermined cross-section being in a direction along the planar direction of the substrate 1 is simply referred to as the width.

Further, the SiC semiconductor device has the gate trench 6. The gate trench 6 penetrates the base region 3 and the source region 4 and reaches the drift layer 2, but is not deeper than the cell deep layer 5. For example, the gate trench has a width of 0.8 μm and a depth of 1.0 μm. The base region 3 and the source region 4 are arranged so as to be in contact with the side surfaces of the gate trench 6. The gate trench 6 has a linear shape. The gate trench 6 is arranged so as to have a width direction in the left and right direction of FIG. 2, a depth in the up and down direction of FIG. 2, and a longitudinal direction in a direction orthogonal to a paper plane of FIG. 2. As shown in FIG. 1, the plural gate trenches 6 are arranged parallel with each other at equal intervals so that each gate trench 6 is interposed between the cell deep layers 5. Thus, the plural gate trenches 6 are arranged in a stripe shape.

A portion of the base region 3 on the side surface of the gate trench 6 serves as the channel region that connects between the source region 4 and the drift layer 2 when the MOSFET 100 is operated. On an inner wall surface of the gate trench 6 including a region corresponding to the channel region, a gate insulating film 7 is formed. Further, a gate electrode 8 is formed on the surface of the gate insulating film 7. The gate electrode 8 is made of a doped Poly-Si. In the present embodiment, the gate trench 6 is filled with the gate insulating film 7 and the gate electrode 8. In this way, the trench gate structure is formed. Although the number of trench gate structures is reduced in FIG. 1 for easy understanding, many similar structures are actually arranged.

On a side opposite to the substrate 1 with respect to the drift layer 2, specifically, on the surfaces of the source region 4, the cell deep layer 5 and the gate electrode 8, a source electrode 9, a gat wiring layer and the like are formed through an interlayer insulating film 10. The source electrode 9 corresponds to a first electrode. The source electrode 9 and the gate wiring layer are made of multiple metals, for example, Ni/Al. Among the multiple metals, at least a portion being in contact with n-type SiC, specifically, the portion being in contact with the source region 4 is made of a metal capable of having an ohmic contact with the n-type SiC. In addition, among the multiple metals, at least a portion being in contact with p-type SiC, specifically, the portion being in contact with the contact region 3a is made of a metal capable of having an ohmic contact with the p-type SiC. The source electrode 9 and the gate wiring layer are electrically insulated from each other by being separated on the interlayer insulating film 10. The source electrode 9 is electrically in contact with the source region 4 and the contact region 3a through a contact hole formed in the interlayer insulating film 10. Also, the gate wiring layer is electrically in contact with the gate electrode 8 through a contact hole formed in the interlayer insulating film 10.

Further, on the back surface side of the substrate 1, a drain electrode 11 is formed. The drain electrode 11 is electrically connected to the substrate 1. The drain electrode corresponds to a second electrode. The structure described above configures the MOSFET 100 with an n-channel type inverted trench gate structure. The MOSFET 100 described above is provided for multiple cells to configure the cell region RC.

On the other hand, in the guard ring part RG, as described above, the recess 20 is formed so as to penetrate the base region 3 and reach the drift layer 2. Therefore, at a position away from the cell region RC, the source region 4 and the base region 3 are removed, and the drift layer 2 is exposed. The cell region RC and a part of the connecting part, which are located inside the recess 20, are projected as an island in a stacking direction of the substrate 1 and the drift layer 2, thereby to form the mesa part. The recess 20 of the present embodiment has the same depth as the gate trench 6.

Further, in a surface layer portion of the drift layer 2 located below the recess 20, multiple p-type guard rings 21 are formed so as to surround the cell region RC and the connecting part RJ. In the present embodiment, as shown in FIG. 1, the guard ring 21 has a square frame shape with rounded four corners. However, the guard ring 21 may have another frame shape, such as a circular frame shape.

The guard ring 21 is formed to extend from a position distant from the surface of the drift layer 2 to a position at a predetermined depth. The guard ring 21 is formed by, for example, ion-implanting a p-type impurity into the drift layer 2. In the present embodiment, the lower surface of the guard ring 21 is at the same depth as the bottom surface of the cell deep layer 5. However, since the guard ring 21 is formed to extend from the position distant from the surface of the drift layer 2, the top surface of the guard ring 21 is located at a position deeper than the top surface of the cell deep layer 5. The guard ring 21 of the present embodiment has the same configuration as the cell deep layer 5 described above except that the depth and the arrangement shape are different from those of the cell deep layer 5. The impurity concentration and the like of the guard ring 21 are the same as those of the cell deep layer 5.

The guard ring part RG is formed with a plurality of p-type guard ring column regions 22. The guard ring column regions 22 connect to the guard rings 21 and extend toward the substrate 1 from the guard rings 21. Specifically, each of the guard ring column regions 22 has a width narrower than that of the guard ring 21 in the predetermined cross section. The guard ring column regions 22 are formed in the drift layer 2 so that a plurality of guard ring regions 22 are connected to a common guard ring 21. In the present embodiment, two guard ring column regions 22 are provided for each guard ring 21. Each of the guard ring column regions 22 is formed so as to surround the cell region RC and the connecting part RJ, similarly to the guard ring 21.

Further, the guard ring column region 22 is formed so as to be separated from the substrate 1. Specifically, the guard ring column region 22 is formed so as to have a depth so that the guard ring column region 22 has a bottom surface in the drift layer 2. In the present embodiment, the guard ring column region 22 is formed so as to have the bottom surface at the interface between the high concentration layer 2b and the low concentration layer 2a.

In the present embodiment, the guard rings 21 and the guard ring column regions 22 are formed so that the n-type charge density increases as the distance from the cell region RC increases. In other words, the guard rings 21 and the guard ring column regions 22 are formed so that the p-type charge density decreases as the distance from the cell region RC increases.

In the present embodiment, as shown in FIG. 1, the guard rings 21 are formed so that the interval between adjacent guard rings 21 increases as the distance from the cell region RC increases toward an outer side opposite to the cell region RC (hereinafter, simply referred to as the outer side). The guard rings 21 and the guard ring column regions 22 are formed so as to satisfy the following relationship.

Figure 3:
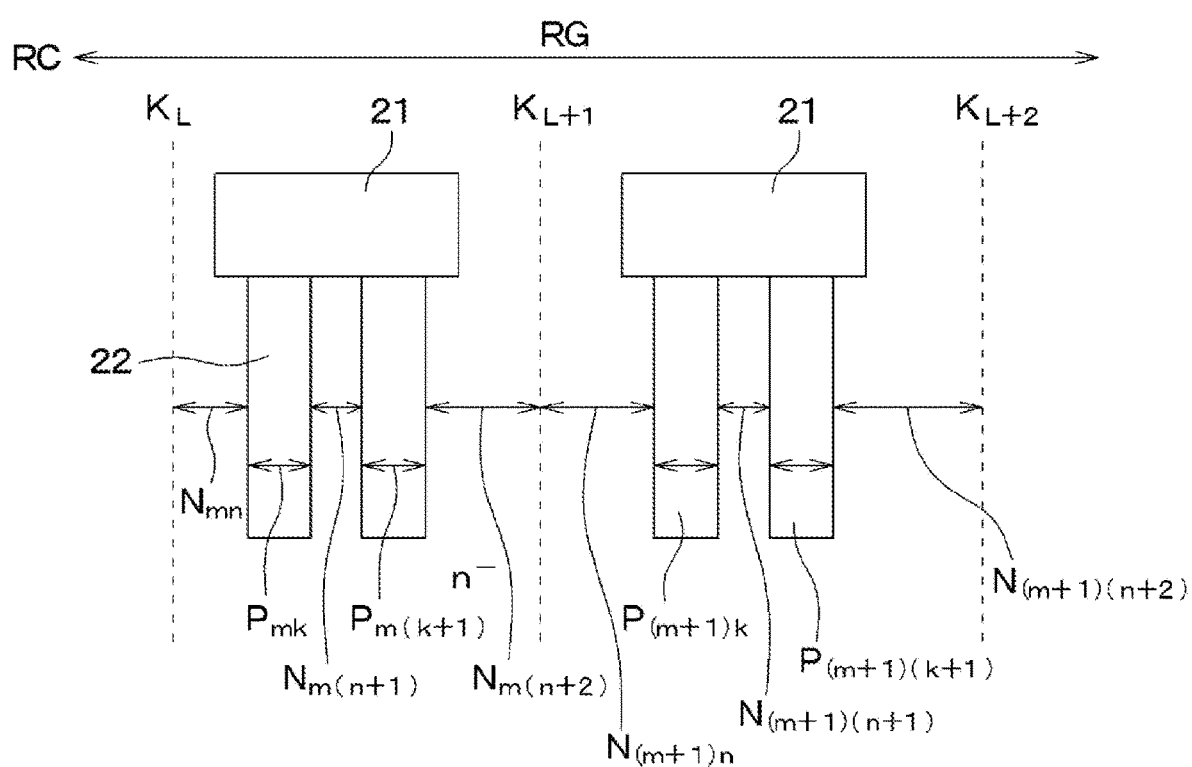
FIG. 3 is an enlarged cross-sectional view of a part of the SiC semiconductor device around a guard ring column region.

First, as shown in FIG. 3, a virtual line passing through the center between the adjacent two guard rings 21 in a direction normal to the planar direction of the substrate 1 is referred to as a virtual line K. Further, an L-th virtual line K from the cell region RC side is referred to as a virtual line $K_L$. An (L+1)-th virtual line from the cell region RC side is referred to as the virtual line $K_{L+1}$, and an (L+2)-th virtual line from the cell region RC side is referred to as the virtual line $K_{L+2}$.

Then, the acceptor concentration is referred to as NA and the donor concentration is referred to as ND. In the guard ring column regions 22 connected to the m-th guard ring 21 from the cell region RC side, a volume of a k-th guard ring column region 22 from the cell region RC side is referred to as $P_{mk}$. In FIG. 3, the guard ring 21 on the left side corresponds to the m-th guard ring 21 from the cell region RC side. Further, in the drift layer 2 located around the guard ring column region 22 connected to the m-th guard ring 21 from the cell region RC side, the volume of an n-th drift layer 2 from the cell region RC side is referred to as $N_{mn}$. The volume of the drift layer 2 here is a volume of the drift layer 2 between the virtual line $K_L$ and the virtual line $K_{L+1}$ at the same depth as the guard ring column region 22. For example, the volume of the drift layer 2 located around the guard ring column region 22 connected to the guard ring 21 on the left side in FIG. 3 is the sum of the following volumes. That is, the volume of the drift layer 2 is the sum of the volume $N_{mn}$ between the virtual line $K_L$ and the guard ring column region 22, the volume $N_{m(n+1)}$ between the adjacent guard ring column regions 22, and the volume $N_{m(n+2)}$ between the virtual line $K_{L+1}$ and the guard ring column region 22.

The guard rings 21 and the guard ring column regions 22 are formed so as to satisfy the following mathematical expression 1.

$$NA\Sigma P_{mk} - ND\Sigma N_{mn} > NA\Sigma P_{(m+1)k} - ND\Sigma N_{(m+1)n} \quad [\text{Ex. 1}]$$

Note that $NA\Sigma P_{mk}$ in the Expression 1 represents the total amount of p-type charges by the guard ring column region 22 arranged between the virtual line $K_L$ and the virtual line $K_{L+1}$. $NA\Sigma P_{(m+1)k}$ represents the total amount of p-type charges by the guard ring column region 22 arranged between the virtual line $K_{L+1}$ and the virtual line $K_{L+2}$. Further, $ND\Sigma N_{mn}$ represents the total amount of n-type charges by the drift layer 2 arranged between the virtual line $K_L$ and the virtual line $K_{L+1}$. $ND\Sigma N_{(m+1)n}$ represents the total amount of n-type charges by the drift layer 2 arranged between the virtual line $K_L$ and the virtual line $K_{L+1}$. By increasing the n-type charge density as the distance from the cell region RC increases, the equipotential lines can be directed toward the outer side.

Although not shown, an equipotential ring (EQR) structure may be formed on an outer periphery of the guard ring portions 21 as needed. In such a case, the guard ring part RG having an outer peripheral breakdown voltage structure surrounding the cell region RC is provided.

In the present embodiment, as shown in FIG. 2, the cell region RC is formed with a plurality of p-type cell column regions 12. The cell column regions 12 connect to the cell deep layers 5, and extend from the cell deep layers 5 toward the substrate 1. In the embodiment, the cell column region 12 has the same depth, width, and impurity concentration as those of the guard ring column region 22. Two cell column regions 12 are provided for each cell deep layer 5.

In the connecting part RJ extending from the cell region RC to the guard ring part RG, a p-type connecting deep layer 30 is formed in the surface layer portion of the drift layer 2. The connecting deep layer 30 is formed so as to connect to the base region 3 and is fixed to the source potential. In the present embodiment, the connecting part RJ is formed so as to surround the cell region RC, as shown by the solid line hatching in FIG. 1. The connecting deep layer 30 is formed in the region shown by the solid line hatching of the connecting part RJ, and is connected to the cell deep layer 5 formed in the cell region RC. The guard rings 21 described above are formed so as to surround the outer periphery of the connecting part RJ.

The connecting deep layer 30 is formed by, for example, ion-implanting a p-type impurity into the surface of the drift layer 2. The impurity concentration and depth of the connecting deep layer 30 are the same as those of the cell deep layer 5 described above. In the present embodiment, the connecting deep layer 30 includes a first connecting deep layer 30a arranged away from the base region 3 and a second connecting deep layer 30b connecting between the first connecting deep layer 30a and the base region 3. The width of the first connecting deep layer 30a is greater than that of the second connecting deep layer 30b. The interlayer insulating film 10 is formed also in the connecting part RJ.

In the present embodiment, the semiconductor device has the structure including the connecting part RJ between the cell region RC and the guard ring part RG as described above. By forming the connecting deep layer 30 in the connecting part RJ, the connecting deep layer 30 is connected to the cell deep layers 5 that are arranged on both sides of the trench gate structure. As a result, the equipotential lines are extended from the cell region RC toward the guard ring part RG while being suppressed from being excessively raised in the cell region RC, and are gradually terminated in the guard ring part RG.

In the present embodiment, the connecting part RJ is formed with a plurality of p-type connecting column regions 31. The connecting column regions 31 connect to the connecting deep layer 30, and extend from the connecting deep layer 30 toward the substrate 1. In the present embodiment, the connecting column region 31 has the same depth, the same width, and the same impurity concentration as those of the guard ring column region 22. Therefore, the equipotential lines are further extended from the cell region RC toward the guard ring part RG, and are gradually terminated in the guard ring part RG.

The SiC semiconductor device of the present embodiment has the configuration as described above. The following describes the operation and advantageous effects of the SiC semiconductor device.

In the SiC semiconductor device as described above, when the MOSFET 100 is turned on, a channel region is formed on the surface portion of the base region 3 located on the side surface of the gate trench 6 by controlling the voltage applied to the gate electrode 8. As a result, the SiC semiconductor device is brought into the on state by a current caused between the source electrode 9 and the drain electrode 11 via the source region 4 and the drift layer 2.

Further, in the off state where no current is caused in the MOSFET 100, even if a high voltage is applied, the entry of the electric field into the bottom portion of the gate trench 6 is suppressed by the cell deep layers 5 and the connecting deep layer 30 that are formed to the position deeper than the trench gate structure. For that reason, the electric field concentration at the bottom portion of the gate trench is reduced. As a result, breakdown of the gate insulating film 7 is restricted.

In the connecting part RJ, the rising of the equipotential lines is suppressed, and the equipotential lines are directed toward the guard ring part RG. In the guard ring part RG, the equipotential lines are gradually terminated as going outward by the guard rings 21. As a result, a desired breakdown voltage can be achieved.

In the present embodiment, the guard ring column regions 22 are disposed in the guard ring part RG. Therefore, the breakdown voltage of the guard ring part RG can be further improved. Since the breakdown voltage of the guard ring part RG can be improved, it is possible to increase the concentration of the drift layer 2, and to reduce the on resistance of the MOSFET 100.

In a configuration having the guard ring column region 22 for the guard ring 21, it is conceivable that only one guard ring column region 22 is provided for one guard ring 21 with the same width as the width of the guard ring 21. However, in such a configuration, the guard ring column part 22 is difficult to be completely depleted, and there is a possibility that the breakdown voltage cannot be sufficiently improved.

In a configuration having the guard ring column region 22 for the guard ring 21, it is also conceivable that only one guard ding column region 22 is provided for one guard ring 21 with the width smaller than that of the guard ring 21. However, in such a configuration, the breakdown voltage may not be sufficiently improved because the distance between the adjacent guard ring column regions 22 is too wide.

In the present embodiment, therefore, the two guard ring column regions 22 are provided for each guard ring 21, and each guard ring column region 22 has the width smaller than that of the guard ring 21. As such, it is less likely that the breakdown voltage will be reduced due to the guard ring column regions 22 being completely depleted. Also, it is possible to suppress a defect that the breakdown voltage cannot be sufficiently improved due to the width between the adjacent guard ring column regions 22 being excessively increased. That is, according to the SiC semiconductor device of the present embodiment, the effects of the guard ring column regions 22 can be sufficiently achieved.

In the present embodiment, the cell region RC is provided with the cell column regions 12, and the connecting part RJ is provided with the connecting column regions 31. Therefore, it is possible to improve the breakdown voltage of the cell region RC and the connecting part RJ.

In the SiC semiconductor device of the present embodiment, each guard ring 21 is formed at a position away from the surface of the drift layer 2. Therefore, the boundary portion of the PN junction between the guard ring 21 and the drift layer 2 is at a position separated from the interlayer insulating film 10. Accordingly, even if the electric field concentration occurs at the PN junction, since the interlayer insulating film 10 is not in contact with the PN junction, the electric field strength applied to the interlayer insulating film 10 can be reduced. As a result, in a case where the interlayer insulating film 10 is formed or in a case where a protective film (not shown) is further formed on the interlayer insulating film 10, an increase in electric field strength at the outermost surface thereof can be suppressed, and the occurrence of creeping fracture can be suppressed. In particular, since SiC is used as the semiconductor material, the electric field intensity at the outermost surface can be increased by use of a high voltage. However, even when SiC is used, the occurrence of creeping breakdown can be suppressed.

Next, a manufacturing method of the SiC semiconductor device of the present embodiment will be described with reference to FIGS. 4A to 4K.

Figure 4A:
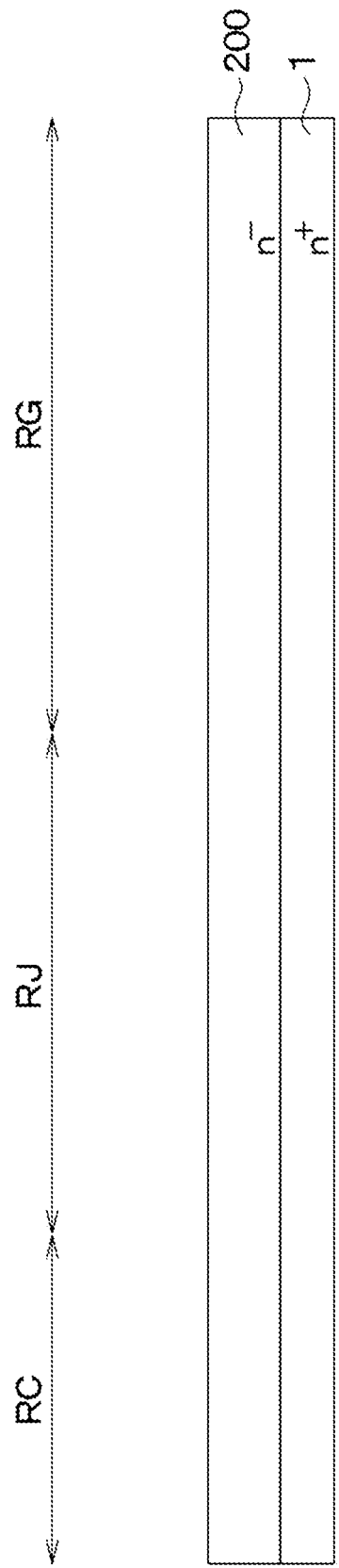
FIG. 4A is a cross-sectional view showing a manufacturing process of the SiC semiconductor device according to the first embodiment.

First, as shown in FIG. 4A, a drift layer formation layer 200 made of SiC is epitaxially grown on the main surface of the substrate 1. In the present embodiment, the thickness of the drift layer formation layer 200 corresponds to the sum of the thickness of the low-concentration layer 2a and the thickness of the portion of the high-concentration layer 2b in which the column regions 12, 22, and 31 are formed. Further, the impurity concentration of the drift layer formation layer 200 is the same as that of the low concentration layer 2a. In the embodiment, the drift layer formation layer 200 corresponds to a first drift layer formation layer.

Next, by performing ion-implantation to the surface layer portion of the drift layer formation layer 200, a first constituent layer 201b is formed, as shown in FIG. 4B. The first constituent layer 201b provides a portion of the high concentration layer 2b adjacent to the low concentration layer 2a. In this case, a portion of the drift layer formation layer 200 in which the first constituent layer 201b is not formed provides the low concentration layer 2a.

Figure 4C:
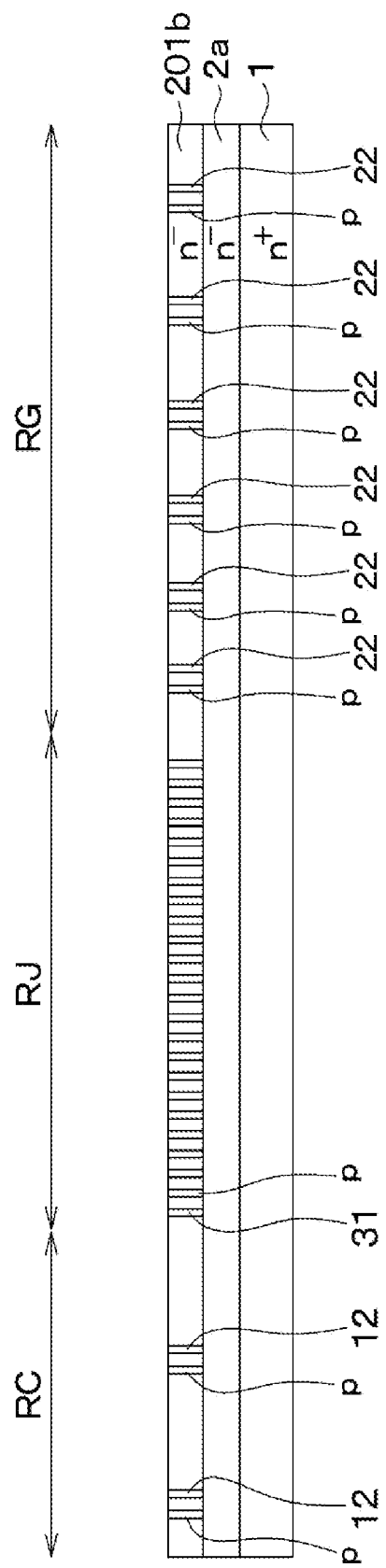
FIG. 4C is a cross-sectional view showing a manufacturing process of the SiC semiconductor device continued from FIG. 4B.

Next, a mask (not shown) is placed on the first constituent layer 201b, and a p-type impurity is ion-implanted so as to simultaneously form the guard ring column regions 22, the cell column regions 12 and the connecting column regions 31, as shown in FIG. 4C. In this case, by appropriately adjusting the acceleration voltage and the like, the guard ring column regions 22, the cell column regions 12 and the connecting column regions 31 are formed to have the bottom surfaces in the first constituent layer 201b. In the present embodiment, each of the column regions 12, 22, and 31 is formed so that the bottom surface is located at the boundary between the first constituent layer 201*b* and the low-concentration layer 2*a*.

Figure 4D:
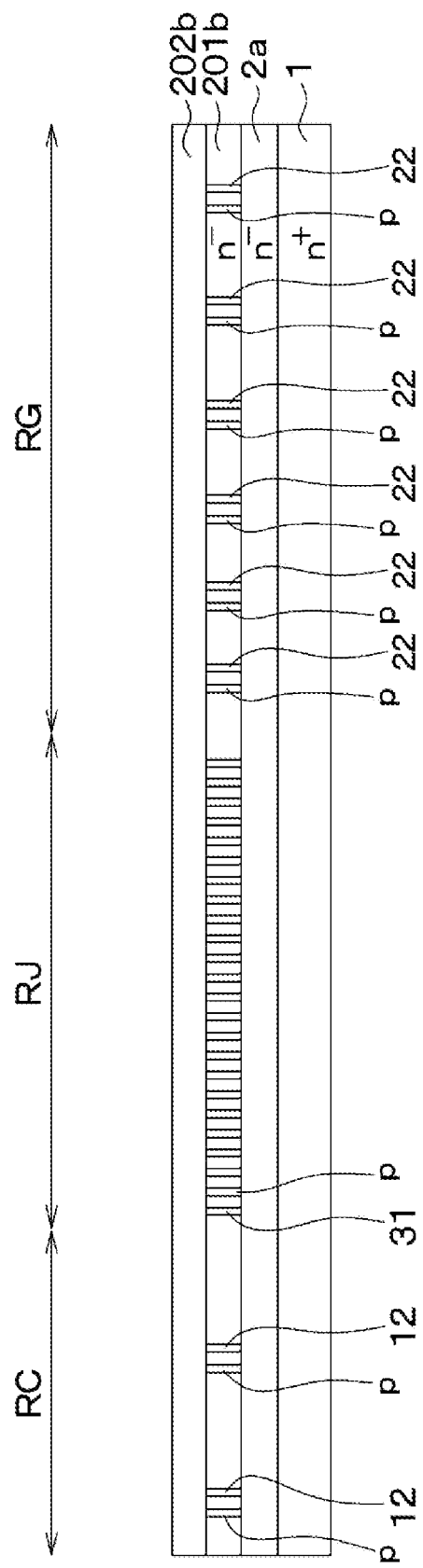
FIG. 4D is a cross-sectional view showing a manufacturing process of the SiC semiconductor device continued from FIG. 4C.

Next, as shown in FIG. 4D, a second constituent layer 202*b* for constituting an intermediate portion of the high concentration layer 2*b* is formed on the first constituent layer 201*b* by epitaxial growth. In the present embodiment, the second constituent layer 202*b* corresponds to a second drift layer constituent layer.

Figure 4E:
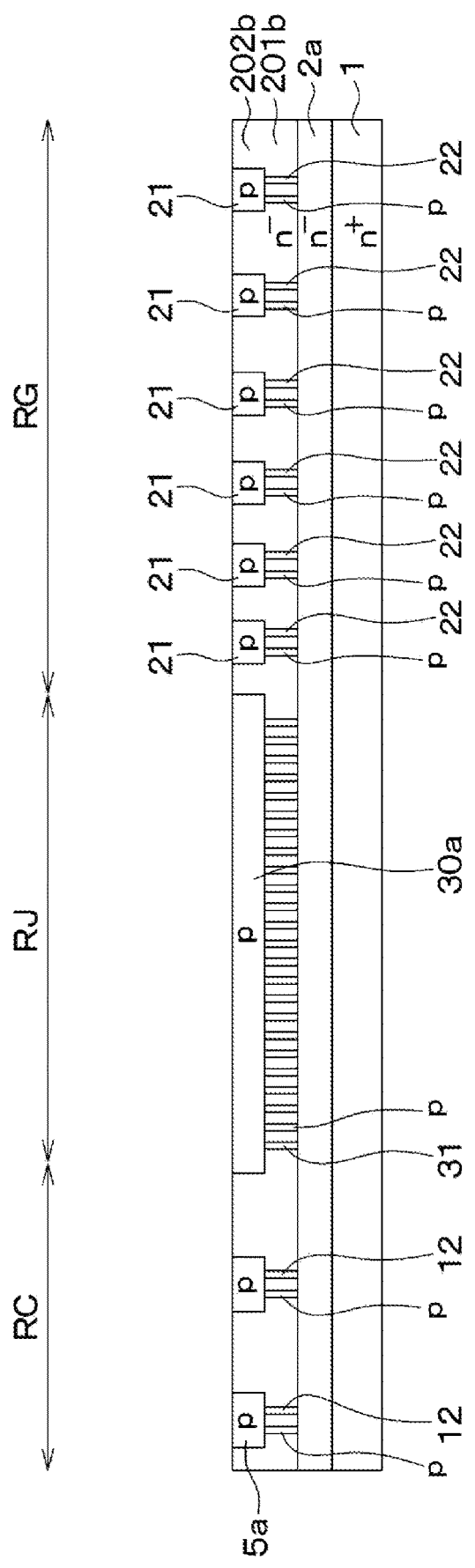
FIG. 4E is a cross-sectional view showing a manufacturing process of the SiC semiconductor device continued from FIG. 4D.

Thereafter, a mask (not shown) is placed on the second constituent layer 202*b*, and a p-type impurity is ion-implanted so as to simultaneously form the guard rings 21, the first cell deep layers 5*a* of the cell deep layer 5, the first connecting deep layer 30*a* of the connecting deep layer 30, as shown in FIG. 4E.

In this case, in the guard ring part RG, the width of the guard ring column region 22 is narrower than the width of the guard ring 21. Therefore, even if a misalignment occurs between the guard ring 21 and the guard ring column region 22, it is possible to suppress the connection between the guard ring 21 and the guard ring column regions 22 from being hindered.

Figure 4F:
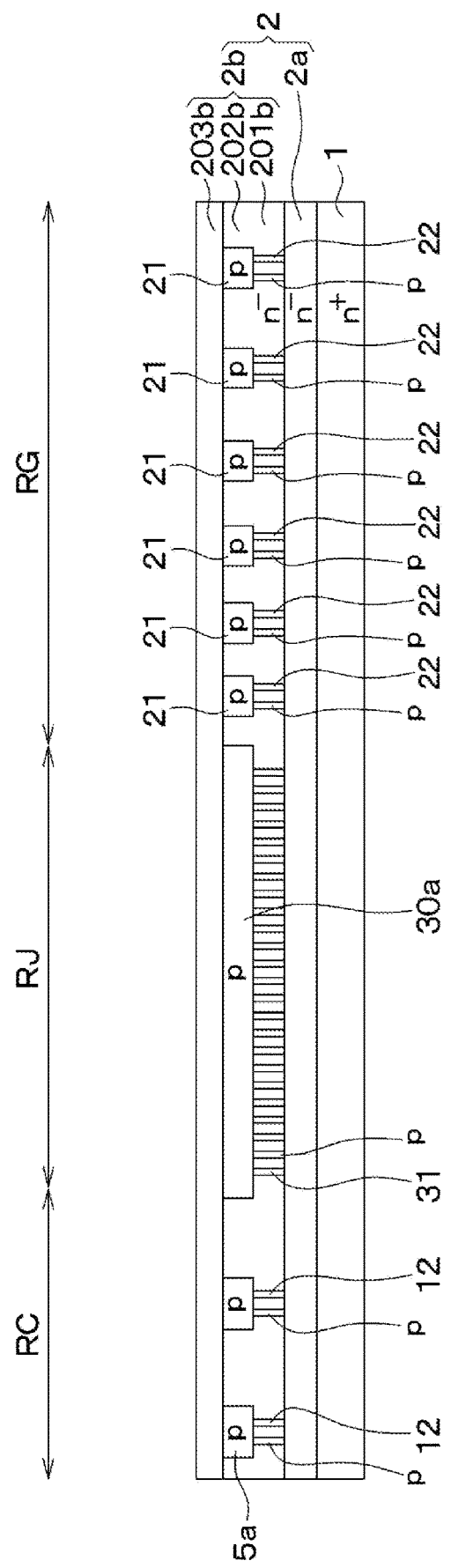
FIG. 4F is a cross-sectional view showing a manufacturing process of the SiC semiconductor device continued from FIG. 4E.

Next, as shown in FIG. 4F, a third constituent layer 203*b* for constituting an upper layer portion of the high-concentration layer 2*b* is formed on the second constituent layer 202*b* by epitaxial growth. As a result, the high-concentration layer 2*b* having the first constituent layer 201*b*, the second constituent layer 202*b*, and the third constituent layer 203*b* is formed, as well as the drift layer 2 having the high-concentration layer 2*b* and the low-concentration layer 2*a* is formed. In the present embodiment, the third constituent layer 203*b* corresponds to a third drift layer constituent layer.

Figure 4G:
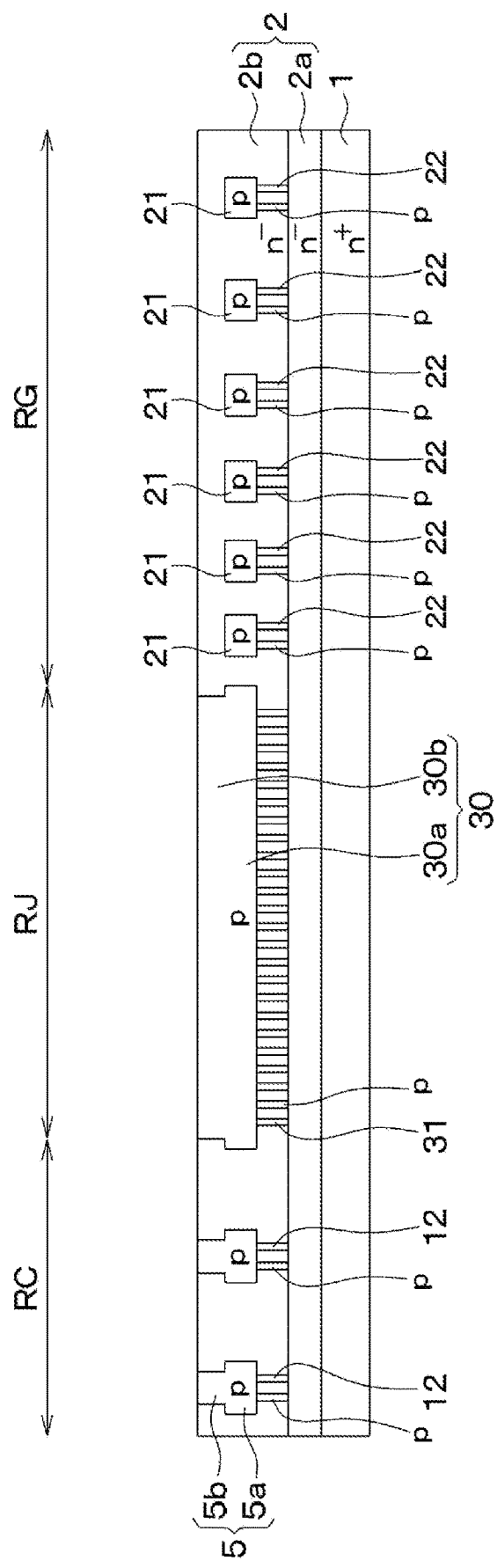
FIG. 4G is a cross-sectional view showing a manufacturing process of the SiC semiconductor device continued from FIG. 4F.

Thereafter, a mask (not shown) is placed on the drift layer 2 and a p-type impurity is ion-implanted. As a result, as shown in FIG. 4G, the second cell deep layer 5*b* is formed, and thus the cell deep layer 5 including the second cell deep layer 5*b* is formed. Also, the second connecting deep layer 30*b* is formed, and thus the connecting deep layer 30 including the second connecting deep layer 30*b* is formed.

Figure 4H:
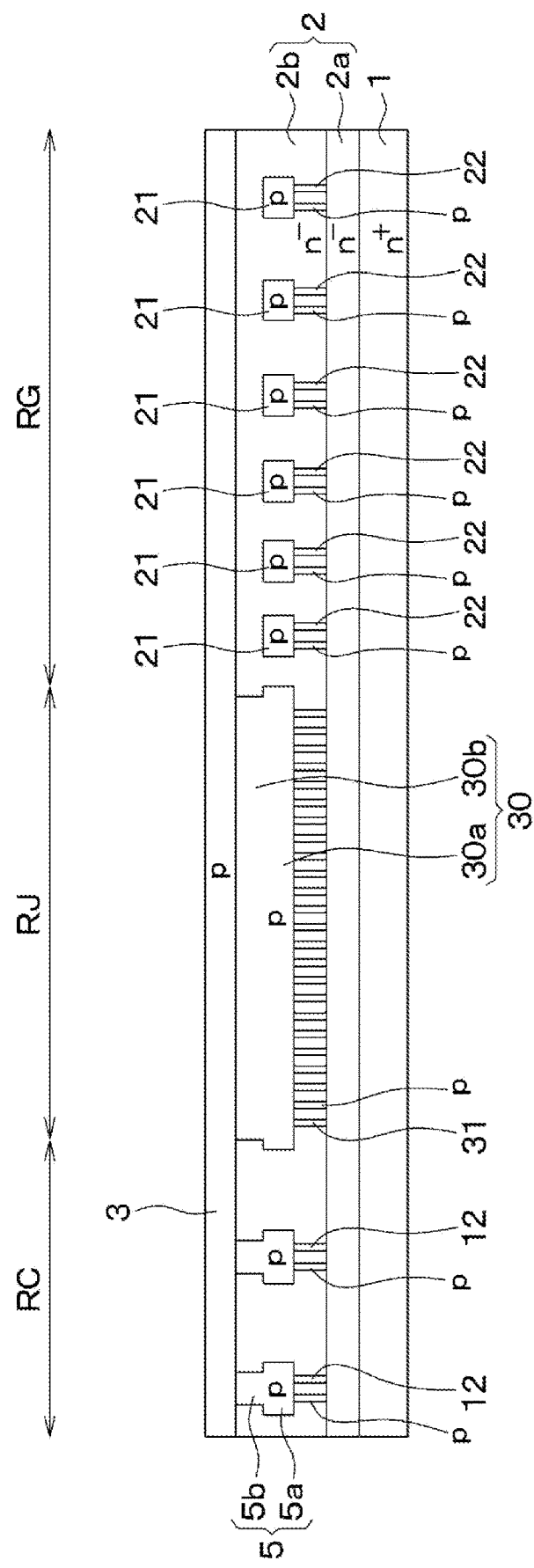
FIG. 4H is a cross-sectional view showing a manufacturing process of the SiC semiconductor device continued from FIG. 4G.

Next, as shown in FIG. 4H, the base region 3 is formed by epitaxial growth on the drift layer 2 including the cell deep layer 5 and the connecting deep layer 30. In this process, the base region 3 is similarly formed in the guard ring part RG.

Figure 4I:
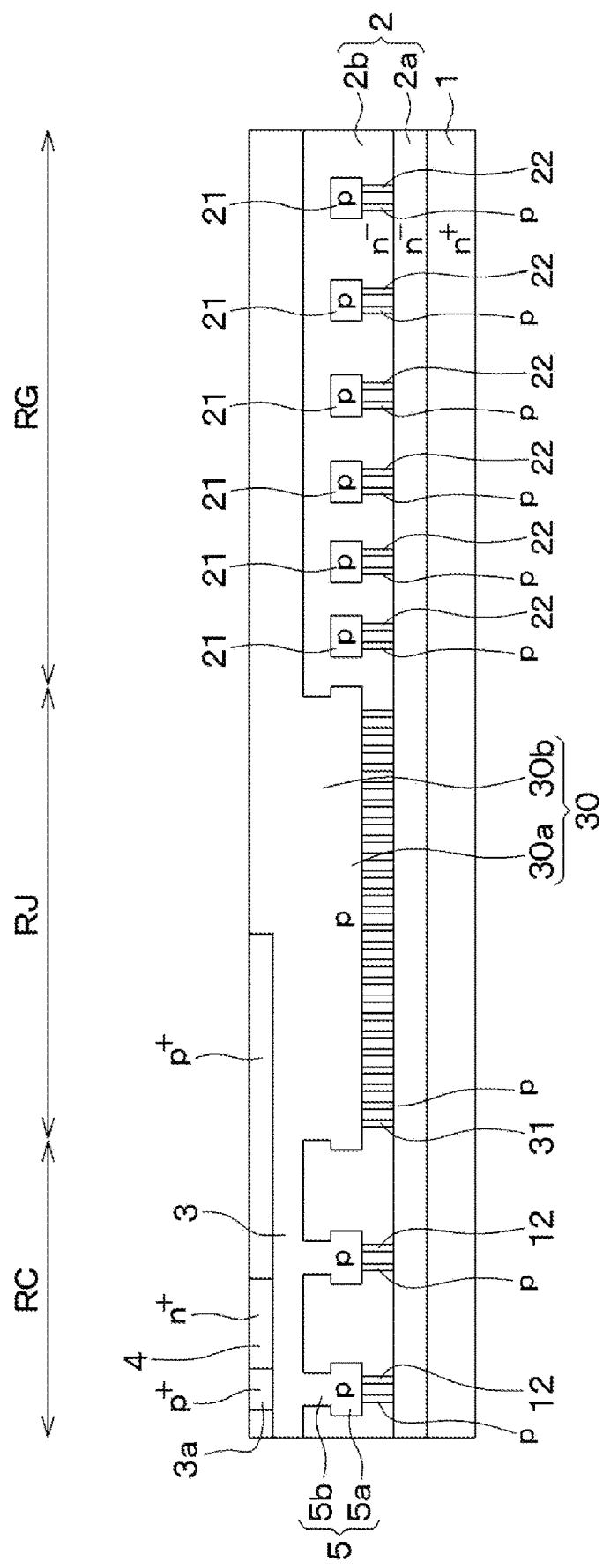
FIG. 4I is a cross-sectional view showing a manufacturing process of the SiC semiconductor device continued from FIG. 4H.

Next, a mask (not shown) is placed on the base region 3 and an n-type impurity is ion-implanted so as to form the source region 4, as shown in FIG. 4I. Further, a mask (not shown) is placed on the base region 3 and a p-type impurity is ion-implanted so as to form the contact region 3*a*. In the present embodiment, the source region 4 and the contact region 3*a* are formed by the ion implantation. As another example, one of the source region 4 and the contact region 3*a* may be formed by epitaxial growth and the other may be formed by ion implantation.

Figure 4J:
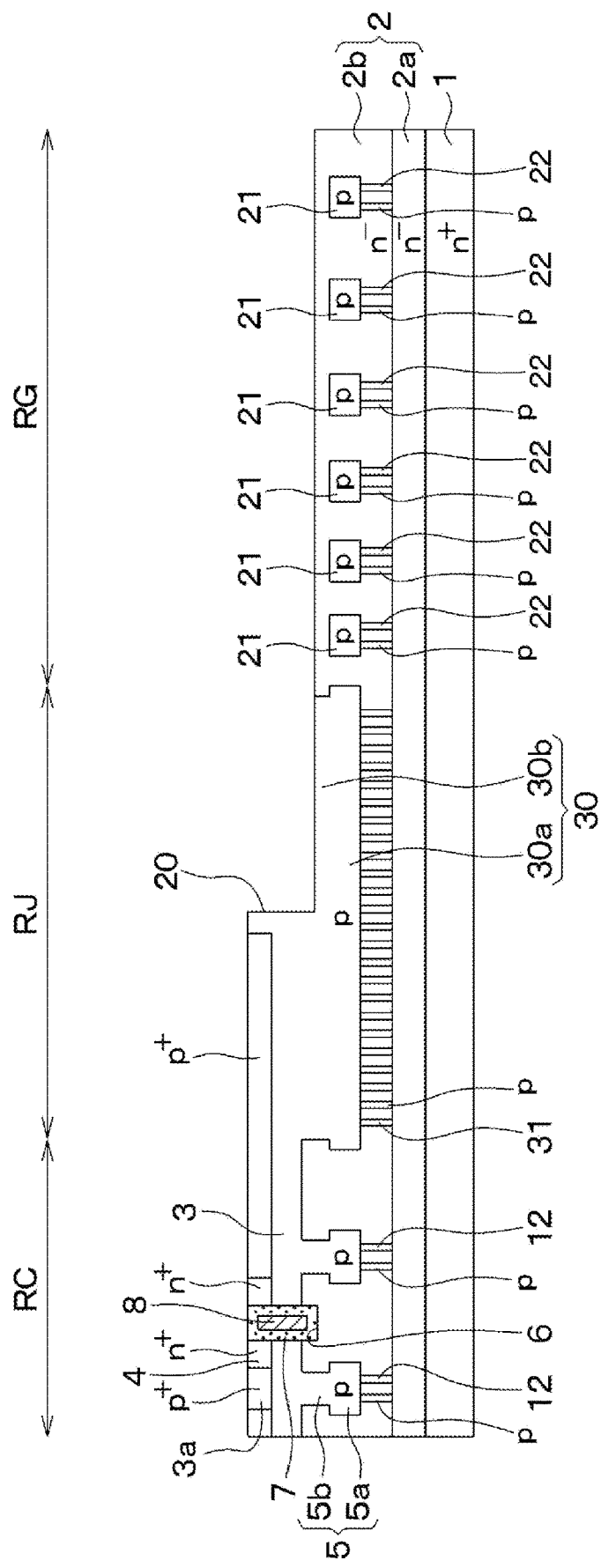
FIG. 4J is a cross-sectional view showing a manufacturing process of the SiC semiconductor device continued from FIG. 4I.

Next, a mask (not shown) is placed on the base region 3, and anisotropic etching such as a reactive ion etching (RIE) using the mask is performed so as to simultaneously form the gate trench 6 and the recess 20, as shown in FIG. 4J. The gate trench 6 and the recess 20 have the same depth, and are formed to be shallower than the top surface of the guard rings 21. In the present embodiment, the gate trench 6 and the recess 20 are formed at the same time. Alternatively, the gate trench 6 and the recess 20 may be formed separately. In such a case, the gate trench 6 and the recess 20 can be made to have different depths. Namely, it is possible to design each of the gate trench 6 and the recess 20 to an optimum depth.

Then, for example, by performing thermal oxidation or the like, the gate insulating film 7 is formed so as to cover the inner wall surface of the gate trench 6 and the surface of the source region 4. Further, a Poly-Si doped with a p-type impurity or an n-type impurity is deposited, and etched back to leave the Poly-Si at least in the gate trench 6. As a result, the gate electrode 8 is formed. In this way, the trench gate structure is formed.

Figure 4K:
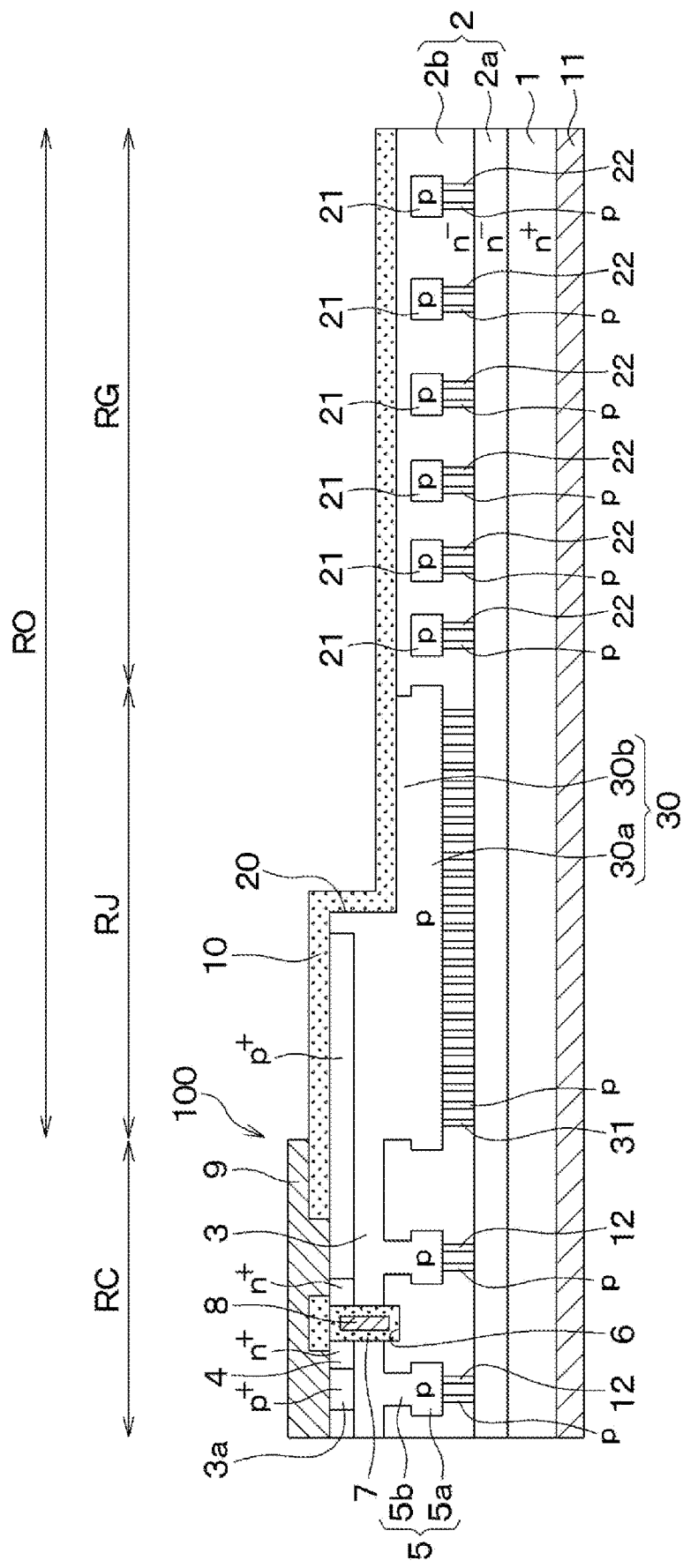
FIG. 4K is a cross-sectional view showing a manufacturing process of the SiC semiconductor device continued from FIG. 4J.

Next, as shown in FIG. 4K, an interlayer insulating film 10 is formed so as to cover the surfaces of the gate electrode 8 and the gate insulating film 7. The interlayer insulating film 10 is, for example, made of an oxide film. Further, a mask (not shown) is formed on the surface of the interlayer insulating film 10, and the interlayer insulating film 10 is patterned by RIE or the like, thereby to form a contact hole that exposes the contact region 3*a* and the source region 4. Next, an electrode material, which is for example made of a stack of plural metal layers is formed on the surface of the interlayer insulating film 10. Then, by patterning the electrode material, the source electrode 9, the gate wiring (not shown), and the like are formed. Further, a process of forming the drain electrode 11 on the back surface side of the substrate 1 and the like are performed. In this way, the SiC semiconductor device according to the present embodiment is manufactured.

According to the present embodiment described above, the guard ring column regions 22 are formed in the guard ring part RG. The width of the guard ring column region 22 is smaller than that of the guard ring 21, and the plurality of guard ring column regions 22 are provided for each guard ring 21. Therefore, the breakdown voltage of the guard ring part RG can be sufficiently improved. As such, even if the impurity concentration of the drift layer 2 is increased, it is possible to suppress the breakdown voltage of the guard ring part RG from being excessively lowered.

(1) In the present embodiment, the cell column regions 12 are formed in the cell region RC. Therefore, it is possible to improve the breakdown voltage of the cell region RC. Further, the cell column regions 12 and the guard ring column regions 22 are formed at the same time. Therefore, it is possible to improve the overall breakdown voltage of the SiC semiconductor device while suppressing the increase in the manufacturing processes.

(2) In the present embodiment, the guard ring part RG has the n-type charge density that increases from the cell region RC side toward the outer side. Therefore, the equipotential lines can be directed further toward the outer side, and the breakdown voltage of the guard ring part RG can be further improved.

(3) In the present embodiment, the width of the guard ring column region 22 is smaller than the width of the guard ring 21. Therefore, when forming the guard ring 21, even if a misalignment occurs between the guard ring 21 and the guard ring column region 22, an occurrence of a defect that the guard ring 21 and the guard ring column region 22 are not connected can be suppressed.

(4) In the present embodiment, the guard ring column region 22 is formed by ion implantation. Therefore, it is possible to suppress an increase in the manufacturing processes, for example, as compared with a case where the guard ring column regions 22 are formed by embedding epitaxial growth or the like.

(5) In the present embodiment, the guard ring column region 22 has the bottom surface at a position separated from the substrate 1. Therefore, it is possible to suppress a steep change in the impurity concentration at the bottom surface of the guard ring column region 22, as compared with a case where the bottom surface of the guard ring column region 22 is in contact with the substrate 1.

(6) In the present embodiment, the guard ring 21 is formed at a position away from the surface of the drift layer 2. The boundary portion of the PN junction between the guard ring 21 and the drift layer 2 is separated from the interlayer insulating film 10. For that reason, even if the electric field concentration occurs in the PN junction, since the interlayer insulating film 10 is out of contact with the PN junction, the electric field intensity to be applied to the interlayer insulating film 10 can be suppressed. Therefore, when the interlayer insulating film 10 is formed or when the protective film (not shown) is formed on the interlayer insulating film 10, an increase in electric field strength at the outermost surface thereof can be suppressed, and the occurrence of creeping fracture can be suppressed.

Second Embodiment

A second embodiment will be described. In the second embodiment, the configuration of the guard ring column regions 22 and the like is changed from that of the first embodiment. The other configurations are the same as those of the first embodiment, and therefore a description of the same configurations will be omitted below.

Figure 5:
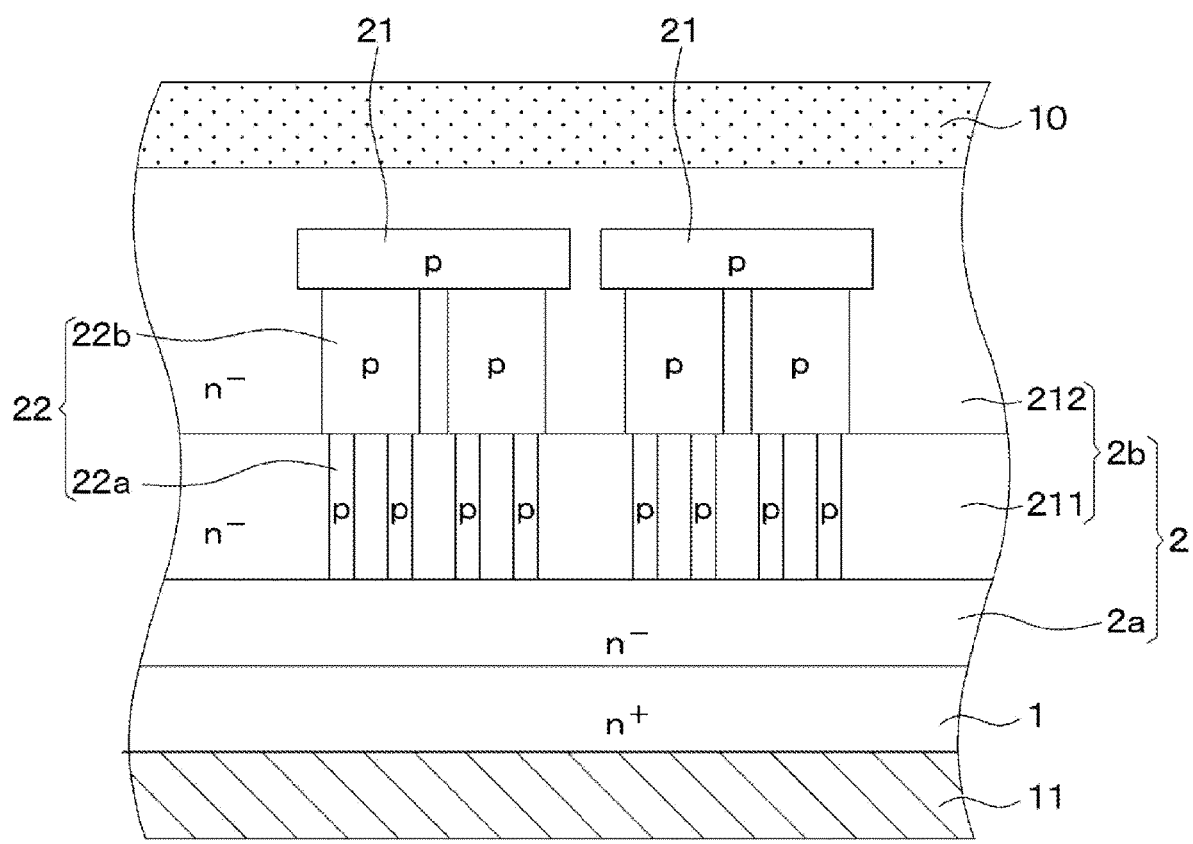
FIG. 5 is an enlarged cross-sectional view of a part of a SiC semiconductor device around a guard ring column region according to the second embodiment.

In a semiconductor device of the second embodiment, as shown in FIG. 5, the guard ring column region 22 includes a first column region 22a and a second column region 22b. The first column region 22 is arranged apart from the guard ring 21. The second column region 22b connects between the guard ring 21 and the first column region 22a. The width of the second column region 22b is smaller than that of the guard ring 21. The width of the first column region 22a is smaller than that of the second column region 22b. Two second column regions 22b are provided for each guard ring 21, and two first column regions 22a are provided for each second column region 22b.

The high-concentration layer 2b includes a first high-concentration layer 211 in which the first column regions 22a are arranged, and a second high-concentration layer 212 in which the second column regions 22b and the guard rings 21 are arranged. The first high-concentration layer 211 has a higher impurity concentration than that of the second high-concentration layer 212. For example, the second high-concentration layer 212 has an n-type impurity concentration of $1.0 \times 10^{16}$ to $5.0 \times 10^{17}/cm^3$, and the first high-concentration layer 211 has an n-type impurity concentration of $1.5 \times 10^{16}$ to $1.0 \times 10^{18}/cm^3$.

According to the present embodiment described above, in the guard ring part RG, the plurality of guard ring column regions 22 are provided for each guard ring 21, and each guard ring column region 22 has a width narrower than that of the guard ring 21. Therefore, the same effects as those of the first embodiment can be achieved.

(1) In the present embodiment, the guard ring column region 22 includes the first column regions 22a and the second column regions 22b. The width of the first column region 22a is smaller than that of the second column region 22b. Therefore, the guard ring column region 22 can be easily extended in the depth direction, and the degree of freedom in design can be improved, for example, as compared with the configuration in which the first column region 22a is directly connected to the guard ring 21.

(2) In the present embodiment, the guard ring column region 22 is configured as described above, and the impurity concentration of the first high-concentration layer 211 can be made higher than the impurity concentration of the second high-concentration layer 212. Therefore, the breakdown voltage of the guard ring part RG can be further improved.

Third Embodiment

A third embodiment will be described. The third embodiment is a modification of the first embodiment, and the manufacturing method of the SiC semiconductor device is changed from that of the first embodiment. The other configurations are the same as those of the first embodiment, and therefore a description of the same configurations will be omitted below.

Figure 6A:
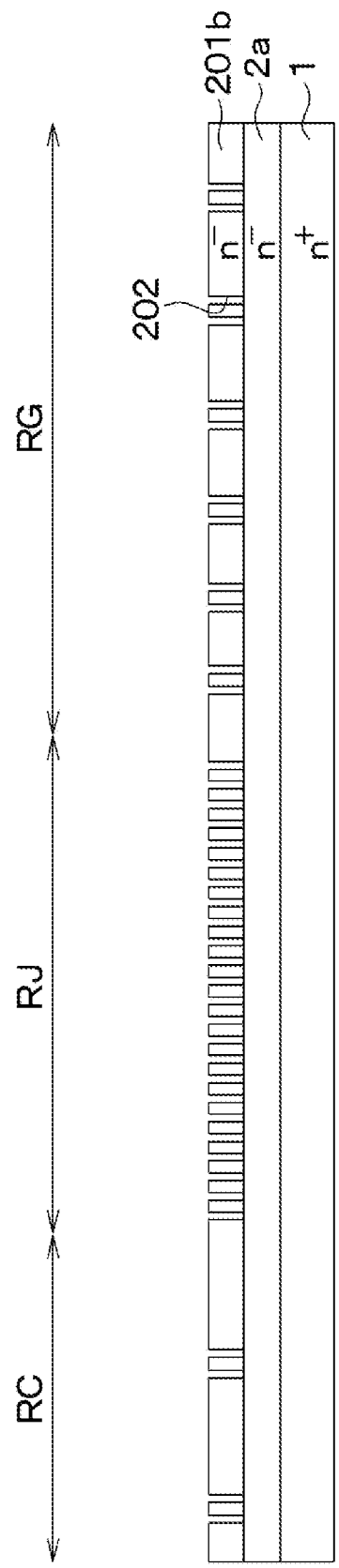
FIG. 6A is a cross-sectional view showing a manufacturing process of a SiC semiconductor device according to a third embodiment.

In the present embodiment, a mask (not shown) is placed on the first constituent layer 201b after performing the process of FIG. 4B. Then, as shown in FIG. 6A, by performing anisotropic etching such as RIE using a mask, the portions where the column regions 12, 22 and 31 are to be arranged are removed, and thus column trenches 202 are formed.

Figure 6C:
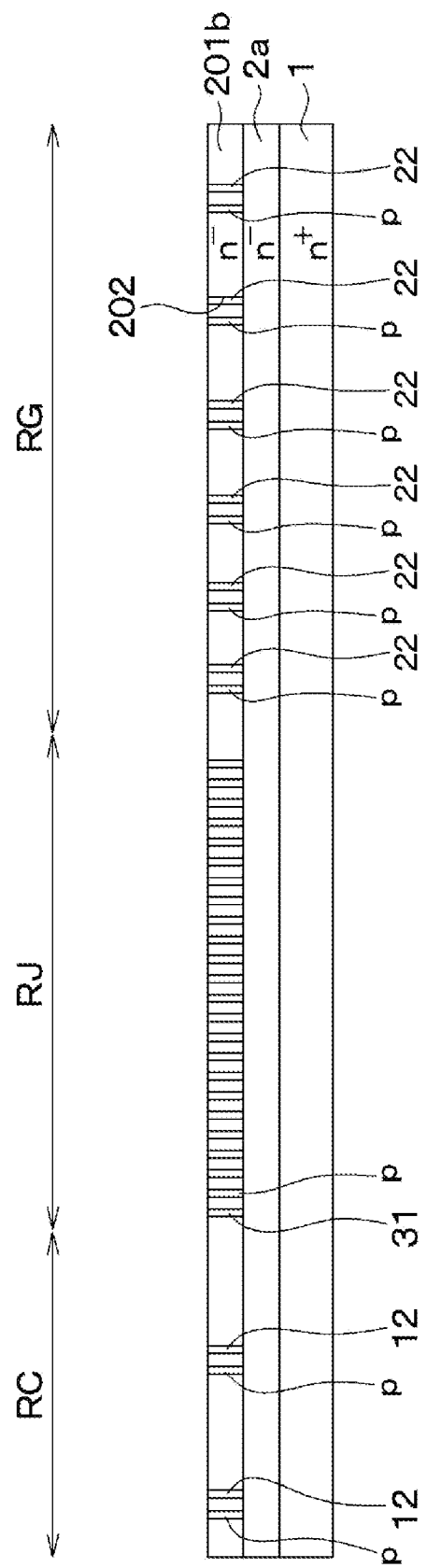
FIG. 6C is a cross-sectional view showing a manufacturing process of the SiC semiconductor device continued from FIG. 6B.

Next, as shown in FIG. 6B, a p-type SiC layer 204 is epitaxially grown, so that the column trenches 202 are embedded. As a result, the SiC layer 204 is embedded in each column trench 202, and the guard ring column region 22, the cell column region 12, and the connecting column region 31 are formed. Thereafter, as shown in FIG. 6C, the SiC layer 204 arranged on the first constituent layer 201b is removed and hand flattening is performed so as to expose the surface of the first constituent layer 201b. In the present embodiment, the SiC layer 204 corresponds to a second conductivity-type layer.

Then, by performing the process of FIG. 4D and subsequent processes, the same SiC semiconductor device as in the first embodiment is manufactured.

According to the present embodiment described above, in the guard ring part RG, the plurality of guard ring column regions 22 are provided for the guard ring 21, and each guard ring column region has a width narrower than that of the guard ring 21. Therefore, the same effects as those of the first embodiment can be achieved.

(1) In the present embodiment, the guard ring column region 22 is formed by epitaxial growth. Therefore, it is possible to suppress the formation of defects in the guard ring column region 22, as compared with a case where the guard ring column region 22 is formed by ion implantation.

Other Embodiments

Although the present disclosure has been described in accordance with the embodiments, it is understood that the present disclosure is not limited to such embodiments or structures. The present disclosure encompasses various modifications and variations within the scope of equivalents. In addition, while the various elements are shown in various combinations and configurations, which are exemplary, other combinations and configurations, including more, less or only a single element, are also within the spirit and scope of the present disclosure.

For example, in each of the embodiments described above, the number of guard ring column regions 22 provided in each guard ring 21 may be three or more instead of two. Further, the number of guard ring column regions 22 provided for each guard ring 21 may be partially different.

In each of the embodiments described above, the guard rings 21 may not have the same width. For example, the guard rings 21 may have different width that increases toward the outer side. Similarly, the guard ring column regions 22 may not have the same width, and may have different width that increases toward the outer side, for example.

Further, in each of the embodiments described above, the guard rings 21 and the guard ring column regions 22 may not be formed so that the n-type charge density increases from the cell region RC side toward the outer side. For example, the guard rings 21 and the guard ring column regions 22 may be formed so that the n-type charge density is constant.

In each of the embodiments described above, when preparing the substrate in which the first constituent layer 201$b$ is arranged on the low-concentration layer 2$a$, as shown in FIG. 4B, it may be prepared as follows. That is, the low-concentration layer 2$a$ may be arranged on the substrate 1 by epitaxial growth, and the first constituent layer 201$b$ may be arranged on the low-concentration layer 2$a$ by epitaxial growth. That is, the low-concentration layer 2$a$ and the first constituent layer 201$b$ may be arranged on the substrate 1 by performing the epitaxial growth twice.

Further, in each of the embodiments described above, the semiconductor device may be configured by using a silicon substrate or the like.

In each of the embodiments described above, the guard ring 21 may be formed so as to be exposed from the surface of the drift layer 2.

In the first embodiment described above, the MOSFET of the n-channel type trench gate structure in which the first conductivity type is n-type and the second conductivity type is p-type has been described as an example of the semiconductor switching element. However, this is merely an example, and a semiconductor switching element of another structure, for example, a MOSFET of a trench gate structure of a p-channel type in which the conductivity type of each component is inverted with respect to the n-channel type may also be used. Other than the MOSFET, the semiconductor device may be formed with an IGBT with the same structure. In the case of the IGBT, the n$^+$-type substrate 1 of the first embodiment described above is changed to the p$^+$-type substrate (i.e., collector layer), and the other configurations are the same as those of the vertical MOSFET described in the first embodiment.

What is claimed is:

1. A semiconductor device comprising:
a cell region provided with a semiconductor element;
an outer peripheral region surrounding an outer periphery of the cell region;
a substrate of a first or second conductivity-type, the substrate providing the cell region and the outer peripheral region;
a drift layer of the first conductivity-type, the drift layer disposed on the substrate and having an impurity concentration lower than that of the substrate, the drift layer providing the cell region and the outer peripheral region;
a first electrode disposed opposite to the substrate with respect to the drift layer, and electrically connected to the semiconductor element provided in the cell region; and
a second electrode disposed opposite to the drift layer with respect to the substrate, and electrically connected to the semiconductor element provided in the cell region, wherein:
the outer peripheral region includes a guard ring part having a plurality of guard rings of the second conductivity-type, and a plurality of guard ring column regions of the second conductivity-type;
each of the plurality of guard rings is disposed in a surface layer portion of the drift layer and has a frame shape surrounding the cell region;
the plurality of guard ring column regions are extended from the guard rings toward the substrate;
each of the plurality of guard ring column regions has a width smaller than a width of each of the plurality of guard rings in a direction along a planar direction of the substrate in a predetermined cross-section defined along the cell region and the outer peripheral region; and
at least two guard ring column regions are provided for each of the plurality of guard rings.

2. The semiconductor device according to claim 1, wherein
the cell region includes:
a base region of the second conductivity-type disposed above the drift layer;
a cell deep layer disposed in the drift layer, connected to the base region, and extending toward the substrate; and
a cell column region of the second conductivity-type extending from the cell deep layer toward the substrate.

3. The semiconductor device according to claim 1, wherein
the guard ring part has a charge density of the first conductivity-type increasing as a function of distance from the cell region toward an outer side opposite to the cell region.

4. The semiconductor device according to claim 3, wherein the plurality of guard ring column regions are provided to satisfy a relationship of:

$$NA\Sigma P_{mk}-ND\Sigma N_{mn}>NA\Sigma P_{(m+1)k}-ND\Sigma N_{(m+1)n},$$

wherein
NA represents an acceptor concentration,
ND represents a donor concentration,
$P_{mk}$ represents a volume of a k-th guard ring column region from a cell region side, of the guard ring column regions connected to an m-th guard ring from the cell region side, and
$N_{mn}$ represents a volume of an n-th drift layer from the cell region side, of the drift layer located around the guard ring column region connected to the m-th guard ring from the cell region side.

5. The semiconductor device according to claim 1, wherein
each of the guard ring column regions includes:
a plurality of first column regions disposed away from the plurality of guard rings; and
a plurality of second column regions connecting between the plurality of first column regions and the plurality of guard rings,
at least two second column regions are provided for each guard ring, and
at least two first column regions are provided for each second column region, and
each first column region has a width smaller than that of the second column region.

6. The semiconductor device according to claim 5, wherein
the drift layer includes:
a first high-concentration layer in which the first column regions are disposed; and
a second high-concentration layer in which the second column regions and the guard ring are disposed, and the first high-concentration layer has an impurity concentration higher than that of the second high-concentration layer.

7. A method for manufacturing a semiconductor device, the semiconductor device including:

a cell region provided with a semiconductor element;

an outer peripheral region surrounding an outer periphery of the cell region;

a substrate of a first or second conductivity-type, the substrate providing the cell region and the outer peripheral region;

a drift layer of the first conductivity-type, the drift layer disposed on the substrate and having an impurity concentration lower than that of the substrate, the drift layer providing the cell region and the outer peripheral region;

a first electrode disposed opposite to the substrate with respect to the drift layer, and electrically connected to the semiconductor element provided in the cell region; and a second electrode disposed opposite to the drift layer with respect to the substrate, and electrically connected to the semiconductor element provided in the cell region, wherein:

the outer peripheral region includes a guard ring part having a plurality of guard rings of the second conductivity-type, and a plurality of guard ring column regions of the second conductivity-type;

each of the plurality of guard rings is disposed in a surface layer portion of the drift layer and has a frame shape surrounding the cell region;

the plurality of guard ring column regions are extended from the guard rings toward the substrate;

each of the plurality of guard ring column regions has a width smaller than a width of each of the plurality of guard rings in a direction along a planar direction of the substrate in a predetermined cross-section defined along the cell region and the outer peripheral region; and at least two guard ring column regions are provided for each of the plurality of guard rings, the method comprising:

preparing the substrate;

arranging a first drift layer constituent portion for constituting the drift layer on the substrate;

forming the plurality of guard ring column regions in the drift layer constituent portion;

arranging a second drift layer constituent portion on the first drift layer constituent portion, after the forming of the plurality of guard ring column regions;

forming the plurality of guard rings in the second drift layer constituent portion to be connected to the guard ring column regions, and arranging a third drift layer constituent portion on the second drift layer constituent portion, to thereby form the drift layer with the first and second drift layer constituent portions.

8. The method according to claim 7, wherein the forming of the plurality of guard ring column regions includes ion-implanting in the first drift layer constituent portion to form the plurality of guard ring column regions.

9. The method according to claim 7, wherein the forming of the plurality of guard ring column regions includes:

forming a plurality of column trenches in the first drift layer constituent portion; and embedding a second conductive layer in the plurality of column trenches, thereby to form the guard ring column regions.

* * * * *